United States Patent [19]

Darmont et al.

[11] Patent Number: 5,296,000
[45] Date of Patent: Mar. 22, 1994

[54] PROCESS AND EQUIPMENT FOR CRYSTALLIZING AN INORGANIC SUBSTANCE

[75] Inventors: Jacques Darmont, Brussels; Léopold Detry, Wavre, both of Belgium

[73] Assignee: Solvay (Société Anonyme), Brussels, Belgium

[21] Appl. No.: 965,397

[22] PCT Filed: Jun. 12, 1991

[86] PCT No.: PCT/BE91/00037
§ 371 Date: Dec. 17, 1992
§ 102(e) Date: Dec. 17, 1992

[87] PCT Pub. No.: WO92/00130
PCT Pub. Date: Jan. 9, 1992

[30] Foreign Application Priority Data

Jun. 22, 1990 [BE] Belgium .............................. 09000645

[51] Int. Cl.⁵ ........................... B01D 9/00; C01D 1/30
[52] U.S. Cl. ..................................... 23/295 R; 23/303; 422/252
[58] Field of Search .............. 23/295 R, 303; 422/252

[56] References Cited

U.S. PATENT DOCUMENTS

| | | | |
|---|---|---|---|
| 1,860,741 | 5/1932 | Jeremiasson | 422/252 |
| 2,042,661 | 6/1936 | Jeremiassen | 422/252 |
| 2,219,776 | 10/1940 | Henderson | 422/252 |
| 3,556,733 | 1/1971 | Hedrick | 422/252 |
| 3,873,275 | 3/1975 | Bennett | 422/252 |
| 4,174,382 | 11/1979 | Menche | 422/252 |
| 4,797,981 | 1/1989 | Ninane et al. | 23/303 |
| 5,124,265 | 6/1952 | Randolph | 422/252 |
| 5,154,909 | 10/1992 | Ninane et al. | 423/499.5 |

FOREIGN PATENT DOCUMENTS

| | | | |
|---|---|---|---|
| 616034 | 10/1991 | Australia . | |
| 352847A1 | 1/1990 | European Pat. Off. . | |
| 288183 | 3/1991 | Fed. Rep. of Germany | 422/252 |
| 648701 | 12/1928 | France . | |
| 2561125 | 9/1985 | France . | |
| 247228 | 9/1969 | U.S.S.R. | 422/252 |
| 418349 | 10/1934 | United Kingdom . | |

OTHER PUBLICATIONS

British Chemical Engineering, Aug., 1971, vol. 16, No. 8, "Two Case Histories in the Design of Crystallisers", J. F. Witte et al., pp. 681–685.
The Chemical Engineer, Jul./Aug., 1974, "Types of Crystallisers", A. W. Bamforth, pp. 443–445.
Ind. Eng. Chem. Fundam., 1980, vol. 19, No. 1, "Fluid Mechanical Description of Fluidized Beds, Experimental Investigation of Convective Instabilities in Bounded Beds", G. P. Agarwal et al., pp. 59–66.
Chemical Engineers' Handbook, 4th Edition, 1963 "Fluidized Bed Systems", pp. 20–43 through 20–46.
precis de genie chimique, J. Givaudon et al., 1960 Chapter VI "Fluidisation", pp. 353–371.

Primary Examiner—Gary P. Straub
Attorney, Agent, or Firm—Spencer, Frank & Schneider

[57] ABSTRACT

Process and installation for crystallising an inorganic substance in a fluidised bed of crystals (14), which is generated by subjecting a solution supersaturated in the substance to be crystallised to an ascending circulation across a distributor (12), located below the bed (14), of a fluidised-bed reactor, a fraction (22) of the supersaturated solution being taken off upstream of the distributor (12) and being recycled downstream of the distributor (12) into the fluidised bed (14) or into the mother liquor from the crystallisation, and the mother liquor being supersaturated for reconstituting the said supersaturated solution.

9 Claims, 3 Drawing Sheets

PROCESS AND EQUIPMENT FOR CRYSTALLIZING AN INORGANIC SUBSTANCE

BACKGROUND OF THE INVENTION

The present invention relates to a process for crystallising an inorganic substance, using a bed of crystals, which is traversed by a solution supersaturated in the substance to be crystallised.

The "OSLO" crystalliser is an apparatus well known for crystallising inorganic substances (British Chemical Engineering, August 1971, Volume 16, No. 8, pages 681 to 685; The Chemical Engineer, July/August 1974, pages 443 to 445; British Patent GB-A-418,349). This known apparatus comprises a vertical cylindrical cell and a vertical tube which is disposed axially in the cell and ends in the immediate vicinity of the bottom of the latter; an annular vertical chamber is thus defined between the axial tube and the cylindrical wall of the cell. In the operation of this known apparatus, a bed of crystals in the annular chamber is used, through which a solution supersaturated in the substance which it is desired to crystallise is caused to flow (for example an aqueous supersaturated solution of sodium chloride). This solution is introduced into the apparatus via the axial tube, in such a way that it radially penetrates the annular chamber, close to the bottom thereof, and subjects the crystals of the bed to a common rotation, comprising an ascending translation along the wall of the cell and a descending translation along the axial tube.

In this known apparatus, the purpose is to produce regular crystalline grains of spherical shape, whose mean diameter should be controllable by an appropriate choice of the dimensions of the apparatus and of the operating conditions. In practice, however, this known apparatus is rather unsuitable for obtaining large spherical grains, particularly due to the fact of attrition generated within the bed of crystals and of the common rotation, to which these are subjected.

In the document EP-A-0,352,847 (SOLVAY & Cie), a process and equipment are described which eliminate the said drawbacks. In this process and this equipment, a fluidised-bed reactor is used and the solution supersaturated in the substance to be crystallised is caused to circulate upwards across a distributor in such a way that, above the latter, the fluidised bed of crystals is generated; the mother liquor from the crystallisation is collected above the bed and recycled to a point upstream of the bed, after it has been supersaturated to reconstitute the original supersaturated solution.

The invention perfects the process and equipment of document EP-A-0,352,847 by providing a means which reduces the risk of parasitic crystal formation below the fluidised bed.

Starting from this situation, the invention relates to a process for crystallising an inorganic substance in a fluidised bed of crystals, which is generated by subjecting a solution supersaturated in the substance to be crystallised to an ascending circulation across a distributor, located below the bed, of a fluidised-bed reactor, the mother liquor from the crystallisation being collected at the bed exit and being supersaturated to reconstitute the said supersaturated solution; according to the invention, a fraction of the supersaturated solution is taken off upstream of the distributor and recycled to a point downstream of the distributor, before the mother liquor is collected.

In the process according to the invention, the crystals of the bed serve as seeds for the crystallisation of the inorganic material by desupersaturation of the supersaturated solution. They are generally small regular crystals of the inorganic substance which it is intended to crystallise.

The level of supersaturation of the supersaturated solution depends on various parameters, in particular the nature of the inorganic material, on its temperature and on the possible presence of solid or dissolved impurities. In practice, everything else being equal, it is advantageous to establish a maximum supersaturation level, which must always be limited in order to avoid accidental crystallisations on the walls of the crystallisation equipment upstream of the crystal bed, and also primary and secondary seeding within the solution.

The solvent of the solution is not critical, and water is generally preferred.

The temperature of the supersaturated solution is not critical. Nevertheless, it has been observed in practice that the rate of crystal growth in the bed is higher, the higher the temperature of the solution. It is advisable, however, for the temperature of the solution to remain below its boiling point at the pressure prevailing in the crystallisation chamber. For example, in the case where the process is applied to the crystallisation of sodium chloride, aqueous sodium chloride solutions can advantageously be used which have a degree of supersaturation of between 0.3 and 0.5 g/kg at a temperature of between 50° and 110° C. The degree of supersaturation expresses the mass of excess inorganic material relative to the mass corresponding to saturation of the solution.

The bed of crystals is a fluidised bed in accordance with the generally accepted definition (Givaudon, Massot and Bensimon—"Précis de génie chimique [Chemical engineering principles]"—Volume 1—Berger-Levrault, Nancy—1960, pages 353 to 370). To fluidise the bed, the stream of the supersaturated solution is caused to pass through a distributor disposed underneath the bed of crystals, in accordance with the usual technique for fluidised-bed reactors. The distributor is a fundamental element of fluidised-bed reactors. Its function is to divide the stream of solution into preferably parallel and vertical thin jets and additionally to impose thereon a defined pressure drop, controlled as a function of the bed dimensions, of the nature of the particles forming the bed, and of the solution (Ind. Eng. Chem. Fundam.— 1980—19—G. P. Agarwal et al.—"Fluid mechanical description of fluidized beds. Experimental investigation of convective instabilities in bounded beds"—pages 59 to 66; John H. Perry—Chemical Engineers' Handbook—4th Edition—1963—McGraw-Hill book company—pages 20.43 to 20.46). It can, for example, be a horizontal plate perforated by regularly distributed orifices, a grate or a horizontal lattice, or an assembly of vertical channels.

Downstream of the bed of crystals, the mother liquor from the crystallisation is collected. This is a solution saturated in the substance to be crystallised. It is treated for converting it into a supersaturated state and then recycled into the supersaturated solution upstream of the distributor. The means used for obtaining supersaturation of the mother liquor are not critical. The supersaturation of the mother liquor can, for example, be obtained by altering its temperature or by subjecting it to partial evaporation.

Details regarding the operation of the fluidised bed, the supersaturated solution, the recycling of the mother liquor and the regeneration of the supersaturated solution are described in the document EP-A-0,352,847 (SOLVAY & Cie).

SUMMARY OF THE INVENTION

According to the invention, a fraction of the supersaturated solution is taken off upstream of the distributor and recycled to a point downstream of the distributor, before the mother liquor from the crystallisation is supersaturated. The function of the fraction taken off from the supersaturated solution is to remove any possible parasitic crystals which would accumulate or form under the distributor as a consequence of an illtimed partial desupersaturation of the supersaturated solution. The fraction of supersaturated solution is therefore taken off in a zone of supersaturated solution where there is a risk of parasitic crystallisation. A suitable zone for taking off the fraction of supersaturated solution is located along the walls of the crystallisation apparatus, below the distributor.

The recycling of the fraction taken off from the supersaturated solution must be carried out before the mother liquor is supersaturated. The said fraction can, for example, be recycled into the fluidised bed or into the mother liquor downstream of the fluidised bed.

The relative rate of the fraction of supersaturated solution taken off to the rate of supersaturated solution passing through the distributor of the fluidised bed depends on diverse parameters, which include in particular the nature of the substance to be crystallised, the degree of supersaturation, the working temperature and the design characteristics of the installation used. It must therefore be determined for each particular case. In general, in the majority of cases, good results are obtained when the rate chosen for the fraction of supersaturated solution taken off is at least equal to 1 % of the rate of supersaturated solution passing through the distributor. It is of no advantage to choose an excessive value for the rate relative to the fraction of supersaturated solution taken off, at the risk of destabilising the fluidised bed. Values of between 1 and 10 % are generally suitable for the ratio between the rate of the fraction of supersaturated solution taken off and the rate of supersaturated solution passing through the distributor of the fluidised bed.

The take-off of the fraction of supersaturated solution and the recycling thereof can be carried out by any known means. One convenient means consists of using a pipe of which one end is connected to the supersaturated solution upstream of the distributor and the other end is connected downstream of the distributor, and conferring to the pipe an appropriate cross-section as a function of the rate imposed for the fraction of supersaturated solution taken off. In this form of embodiment of the invention, it is important to avoid an ill-timed crystallisation in the pipe by accidental partial desupersaturation of the fraction of supersaturated solution taken off. For this purpose, it is advantageous to heat-insulate the pipe in a suitable manner and to heat its wall. In an advantageous embodiment of the process according to the invention, a pipe is used which passes through the distributor and at least a part of the fluidised bed of crystals. In this embodiment of the invention, the wall of the pipe is permanently held at the temperature of the bed and of the supersaturated solution, which reduces the risk of an accidental crystallisation in the pipe.

The invention also relates to equipment for crystallising an inorganic substance by means of a process according to the invention, which equipment comprises a vertical tubular shell, a vertical tube disposed axially in the tubular shell and ending near the bottom thereof, thus forming an annular chamber in the shell, a device for feeding a solution supersaturated in the substance to be crystallised and connected to the upper end of the tube, a distributor for a fluidised-bed reactor in the annular chamber which is divided by the distributor into a bottom inlet chamber for the supersaturated solution and a top crystallisation chamber constituting the fluidised-bed reactor, and an extraction line for the mother liquor from the crystallisation, which line connects the crystallisation chamber to the feed device, the said equipment furthermore comprising at least one pipe which connects the bottom inlet chamber to the top crystallisation chamber.

In a particular embodiment of the equipment according to the invention, the distributor is fitted with a thermostat whose function it is to maintain the distributor at a uniform temperature which is controlled as a function of that of the supersaturated solution used, in order to avoid a spontaneous crystallisation of the inorganic substance on contact with the distributor. The thermostat can therefore comprise means for heating or cooling the distributor, depending on whether the equipment is intended for the treatment of supersaturated solutions of inorganic substances whose solubility is an increasing or decreasing function of the temperature. Particular features and details regarding the distributor of the fluidised bed are described in the document EP-a-0,352,847 (SOLVAY & Cie).

In the equipment according to the invention, the cross-section of the pipe is controlled so that, during operation of the equipment, a rate of supersaturated solution circulates in the pipe which is equal to a defined, preset fraction of the rate of supersaturated solution passing through the distributor. The pipe can be disposed outside the tubular shell. In this case, it is generally necessary to heat-insulate it and to heat its wall in order to avoid a desupersaturation of the fraction of supersaturated solution circulating therein during the operation of the equipment.

In a preferred embodiment form of the equipment according to the invention, the pipe is disposed in the interior of the annular chamber and passes through the distributor. This embodiment form of the invention has the advantage that the pipe is permanently held at the temperature of the bed of crystals during the operation of the installation. This reduces the risk of an accidental crystallisation in the pipe.

The process and the equipment according to the invention allow an inorganic substance to crystallise in the form of regular grains of approximately spherical shape. These are generally monolithic beads, which means that they are unitary, non-agglomerated blocks of the inorganic material. The process and the equipment according to the invention are used with special advantage for the production of sodium chloride crystals in the form of monolithic spherical beads of a diameter greater than 3 mm, for example between 3 and 30 mm. Sodium chloride crystals having a diameter of between 5 and 10 mm have an important use for the production of salt in the form of irregular grains and of a transparent and glassy appearance by the technique described in the document EP-A-162,490 (SOLVAY & Cie).

Particular features and details of the invention will be clear from the following description, by reference to the attached drawings.

BRIEF DESCRIPTION OF THE DRAWINGS

In these figures, the same reference symbols designate identical elements.

DETAILED DESCRIPTION

Figure 1:
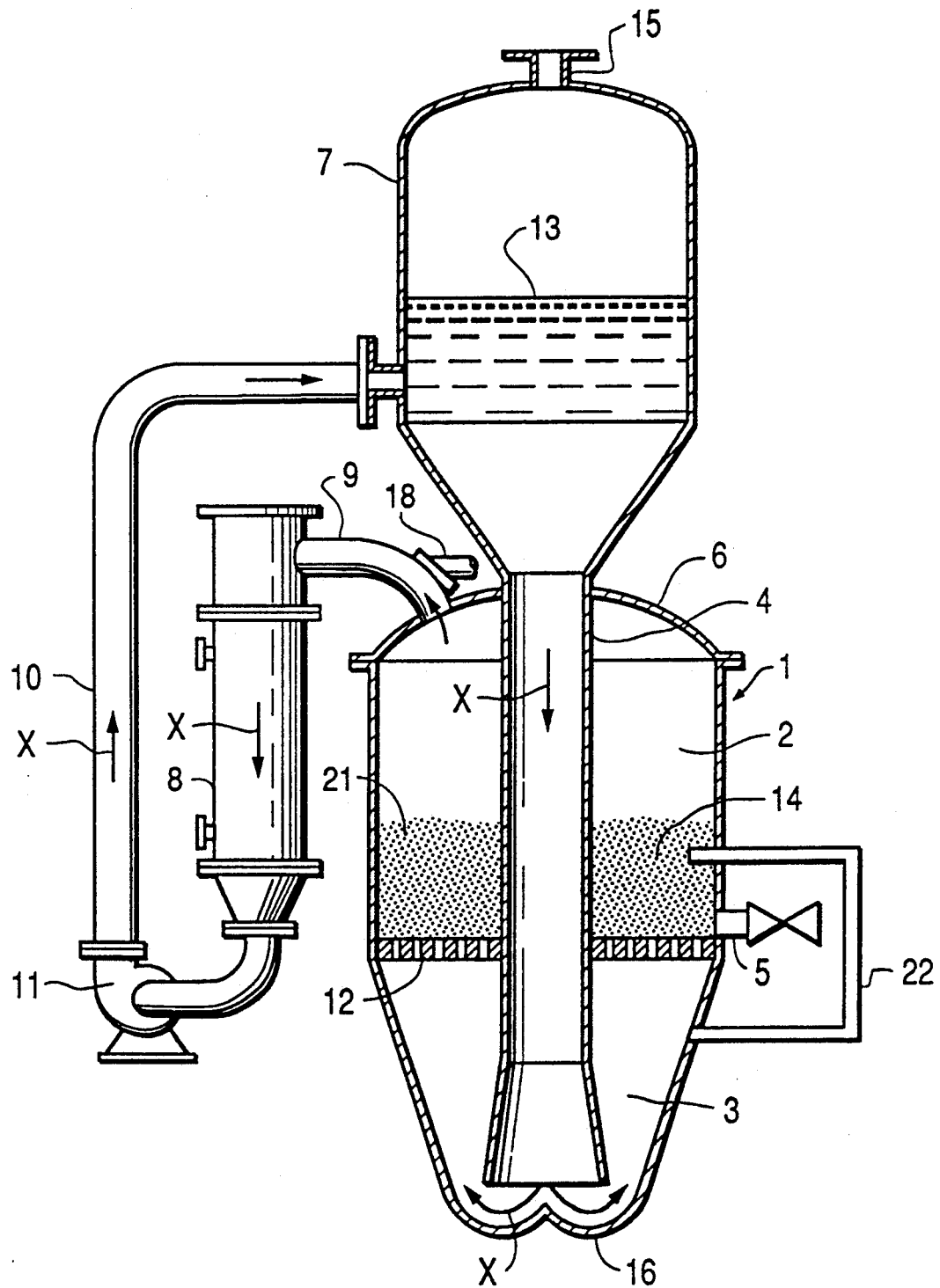
FIG. 1 shows, in transverse vertical section, a particular embodiment form of the equipment according to the invention.

The equipment shown in FIG. 1 is a crystalliser of the type described in the document EP-A-0,352,847 (SOLVAY & Cie) and modified in accordance with the present invention. It comprises a vertical tubular shell 1, in which a vertical tube 4, whose lower part is widened, is disposed axially. The tube 4 thus defines in the shell 1 an annular chamber comprising a cylindrical upper zone 2 and a lower frusto-conical zone 3, whose bottom 16 has the profile of a toric surface around a central axial cone. The shell 1 is closed by a cover 6, through which the tube 4 ending in a holding chamber 7 passes. A reheater 8 is interposed between the top of the upper zone 2 and the expansion chamber 7, via the lines 9 and 10 and a circulation pump 11.

The upper zone 2 is intended to contain a bed of crystals 14 and to be used as a fluidised-bed reactor. For this purpose, it is separated from the lower zone 3 by a distributor 12 for the fluidised-bed reactor. In the equipment of FIG. 1, the upper annular zone 2 constitutes a crystallisation chamber and the lower annular zone 3 serves as the inlet chamber for a solution supersaturated in an inorganic substance which it is desired to crystallise.

According to the invention, a pipe 22 connects the two annular chambers 2 and 3.

The equipment shown in FIG. 1 is especially suitable for the crystallisation of sodium chloride in the form of spherical beads. For this purpose, the equipment is filled with an aqueous solution of sodium chloride up to the level 13 in the expansion chamber 7, to ensure that the crystallisation chamber 2 is flooded. In addition, the latter contains a bed of sodium chloride crystals 14, above the distributor 12.

During operation of the equipment, the aqueous solution of sodium chloride is caused by the pump 11 to circulate in the direction of the arrows X. At the outlet of the chamber 2, via the line 9, the solution saturated in sodium chloride passes through the reheater 8, which raises its temperature, and then enters the expansion chamber 7, where it is partially vapourised by flashing, whereby it is cooled and supersaturated. The water vapour released is extracted through a top orifice 15 of the expansion chamber 7. The supersaturated aqueous solution descends vertically in the tube 4 and radially enters the chamber 3, along the toric bottom 16. In the chamber 1, the supersaturated solution divides into two distinct streams: a main stream passes through the distributor 12 and enters the crystal bed 14 which it fluidises; simultaneously, a stream at lower rate is taken off through the pipe 22 and recycled into the fluidised bed 14, where it rejoins the main stream. The supersaturated solution is progressively desupersaturated while it is passing through the fluidised bed 14, whose crystals consequently grow and redistribute themselves in horizontal layers or strata, as a function of their granulometric dimensions. The coarse granulometric fractions progress downwards in the bed and are periodically taken off through a discharge line 5. The mother liquor from the crystallisation which reaches the top of the chamber 2 is an aqueous solution which is saturated (or slightly supersaturated) in sodium chloride. It is recycled into the reheater 8, via the line 9, where it is made up with saturated aqueous sodium chloride solution by means of a branch 18. The make-up with aqueous sodium chloride solution is controlled to compensate for the quantity of sodium chloride which has crystallised in the bed 14 and for the quantity of water evacuated by evaporation in the expansion chamber 7.

During the operation of the equipment in the manner described above, the distributor 12 is heated in such a way that its wall in contact with the solution is at a temperature which is higher than the temperature of the supersaturated solution in the zone 3 upstream of the distributor 12. In this way, parasitic crystallisation on the distributor is avoided. Information concerning the design and heating of the distributor 12 is described in the document EP-A-0,352,847 (SOLVAY & Cie).

In the equipment of FIG. 1, the rate of solution taken off through the pipe 22 is controlled by an appropriate choice of the pipe dimensions. As a variant, a valve with controllable opening can be mounted on the pipe 22. Furthermore, the pipe 22 must be heat-insulated to ensure that the supersaturated solution of sodium chloride circulating therein is not subjected there to cooling, followed by parasitic crystallisation. If required, the pipe must be heated. The function of the stream of solution taken off through the pipe 22 is to extract the parasitic crystals from the chamber 3, which would accumulate there. For this purpose, the pipe 22 is connected to a zone of the chamber 3, where there is a risk of parasitic crystallisation. If required, a plurality of pipes connected to distinct zones of the chamber 3 can be provided.

Figure 2:
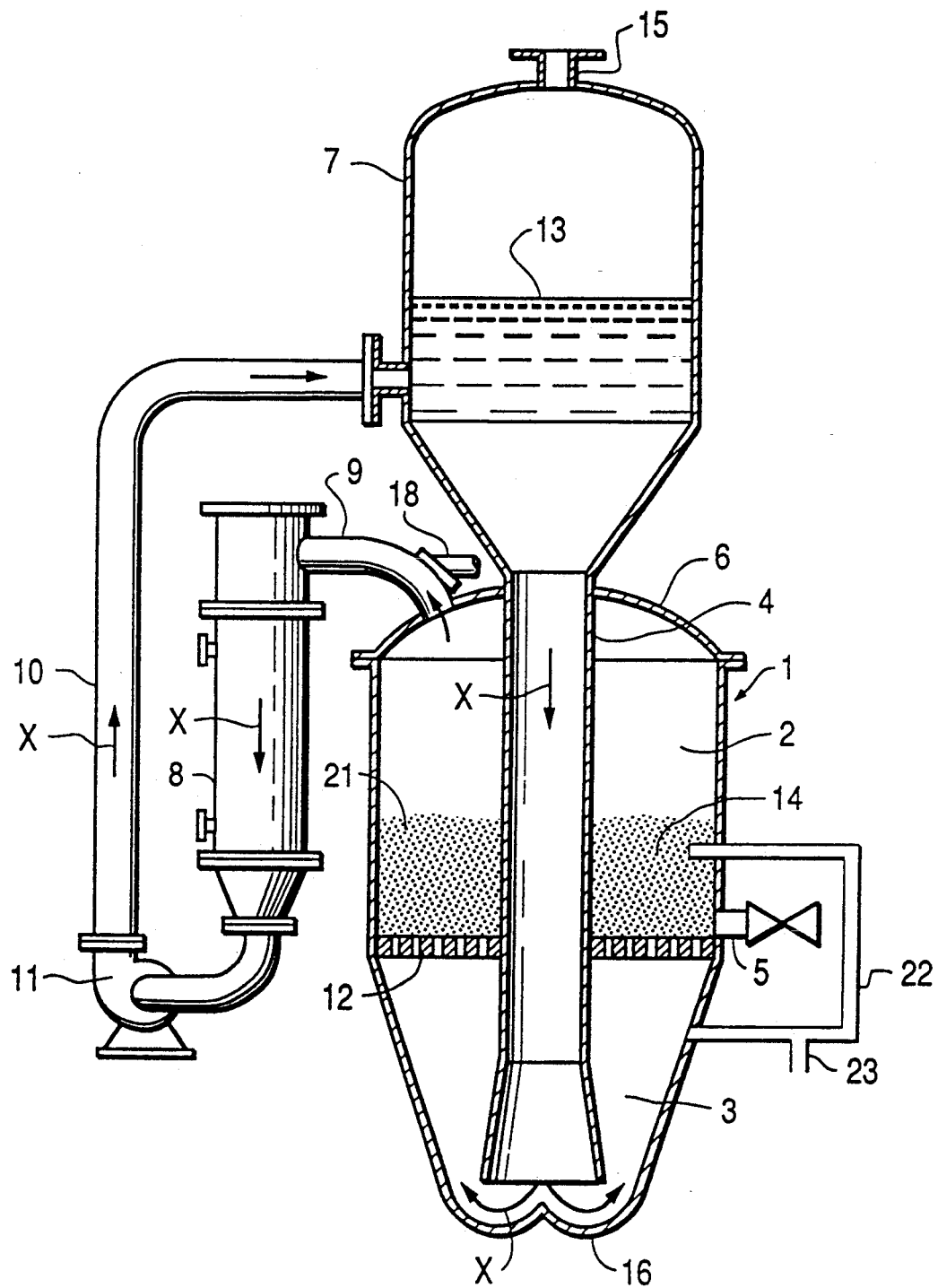
FIG. 2 is a view, analogous to FIG. 1, of a second embodiment form of the equipment according to the invention.

In the equipment shown in FIG. 2, the pipe 22 is connected to the chamber 2 above the free surface 21 of the fluidised bed 14. A line 23 leading into the pipe 22 serves to add thereto a controlled quantity of water, with the object of desupersaturating the fraction of supersaturated solution passing through the pipe 22.

Figure 3:
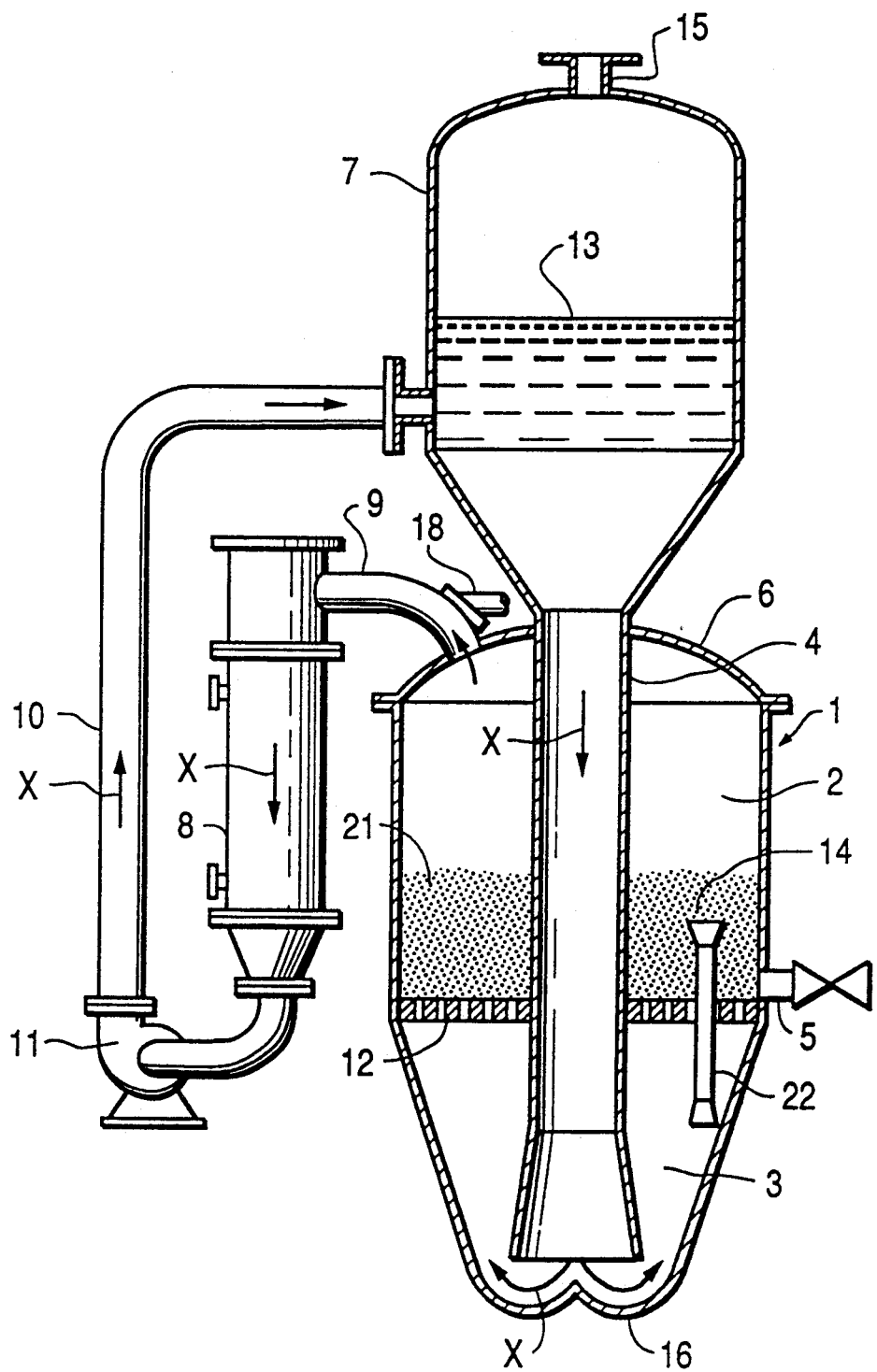
FIG. 3 is a view, analogous to FIG. 1, of a preferred embodiment form of the equipment according to the invention.

In the embodiment form shown in FIG. 3, the pipe 22 is located in the interior of the shell 1 and passes through the grate 12. Its lower end is preferably widened and is located in the vicinity of a zone of the wall of the lower chamber 3, where there is a risk of parasitic crystallisation. The upper end of the pipe is preferably widened and leads into the fluidised bed 14. This form of embodiment has the advantage that the pipe 22 is maintained at the temperature prevailing in the interior of the shell 1, which reduces the risk of parasitic crystallisation in the interior of the pipe. Advantageously, the equipment comprises a plurality of pipes 22 passing through the grate 12 and uniformly distributed in the shell 1.

We claim:

1. A process for crystallizing an inorganic substance in a fluidized bed of crystals, comprising:
generating a fluidized bed of crystals by passing a feed solution supersaturated in said inorganic substance in an ascending flow through a distributor located below the fluidized bed of a fluidized bed crystallizer, crystallizing said inorganic substance in a crystallization zone containing the fluidized bed of crystals, the mother liquor from the crystallization zone exiting the crystallization zone downstream of the fluidized bed, said mother liquor being recycled and used in the reconstitution of said feed solution, removing a fraction of said feed solution from the ascending circulation upstream of the distributor, and supplying said fraction to the crystallization zone downstream of the distributor, at a location prior to the mother liquor exiting the crystallization zone.

2. A process according to claim 1 wherein said fraction of said feed solution is supplied into the fluidized bed.

3. A process according to claim 1 wherein said fraction of said feed solution is supplied into the crystallization zone downstream of the fluidized bed.

4. A process according to claim 1, wherein said fraction of said feed solution is taken off from the location of a parasitic crystallization.

5. A process according to claim 1, wherein said fraction of said feed solution is between 1 and 10% of the amount of said feed solution passing through the distributor.

6. A process according to claim 1, wherein a bed of sodium chloride crystals and a supersaturated aqueous solution of sodium chloride is used.

7. Equipment for crystallising an inorganic substance by the process according to claim 1, comprising a vertical tubular shell (1), a vertical tube (4) disposed axially in the tubular shell and ending near the bottom (16) thereof, thus forming an annular chamber (2, 3) in the shell (1), a device (7) for feeding a solution supersaturated in the substance to be crystallised and connected to the upper end of the tube (4), a distributor (12) for a fluidised-bed reactor in the annular chamber which is divided by the distributor into a bottom inlet chamber (3) for the supersaturated solution and a top crystallisation chamber (2) constituting the fluidised-bed reactor, and an extraction line (9) for the mother liquor from the crystallisation, which line connects the crystallisation chamber (2) to the feed device (7), characterised in that it comprises at least one pipe (22) which connects the bottom inlet chamber (3) to the top crystallisation chamber (2), in parallel with the distributor (12).

8. Equipment according to claim 1, characterised in that the pipe (22) is disposed in the interior of the annular chamber (2, 3) and passes through the distributor (12).

9. Equipment according to claim 8, characterised in that the lower end of the pipe (22) is located against the wall of the tubular shell (1) which is tapering in the bottom inlet chamber (3), and the upper end of the pipe (22) leads into the crystallisation chamber (2) below the top level (21) of the fluidised bed (14).

* * * * *